Figure 1:
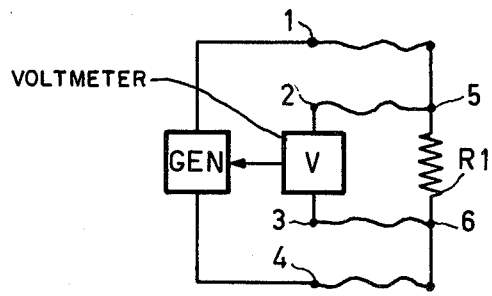

United States Patent [19]
Vermolen

[11] 3,970,930
[45] July 20, 1976

[54] CURRENT METER

[75] Inventor: Johannes Volkert Vermolen, Beekbergen, Netherlands

[73] Assignee: U.S. Philips Corporation, N.Y., N.Y.

[22] Filed: Sept. 17, 1974

[21] Appl. No.: 506,783

[30] Foreign Application Priority Data
Sept. 22, 1973 Netherlands.................... 7313095

[52] U.S. Cl............................. 324/98; 307/202 R; 317/31; 324/51; 324/110
[51] Int. Cl.².................. G01R 17/02; G01R 1/36
[58] Field of Search...................... 324/98, 110, 51; 317/31, 18 R; 323/22 T; 322/28; 340/256; 317/33; 307/202

[56] References Cited
UNITED STATES PATENTS

| | | | |
|---|---|---|---|
| 3,098,192 | 7/1963 | Levy, Jr. et al. | 323/22 T |
| 3,463,966 | 8/1969 | Evans et al. | 324/110 |
| 3,617,886 | 11/1971 | Werme | 324/110 |

Primary Examiner—R. V. Rolinec
Assistant Examiner—Ernest F. Karlsen
Attorney, Agent, or Firm—Frank R. Trifari; Bernard Franzblau

[57] ABSTRACT

The invention relates to the supervision of a measuring circuit which is connected to a load by way of measuring leads. This load is connected to a generator via supply leads. The load is bridged by a resistor. If one of the four said leads is interrupted, the potential on one of the ends of the resistor changes. As a result, a transistor becomes conductive, which implies an error signal. In a preferred embodiment, two transistors are provided, the first transistor being rendered conductive by a voltage difference. The second transistor is rendered conductive either by a voltage difference or by the fact that the first transistor becomes conductive.

10 Claims, 5 Drawing Figures

U.S. Patent  July 20, 1976  3,970,930

CURRENT METER

The invention relates to a device for supervising a measuring circuit which is connected to a load through which an electric current can be passed, a first end of said load being connected by a supply lead to a first supply terminal and by a measuring lead to a first measuring terminal, a second end of said load being connected by a supply lead to a second supply terminal and by a measuring lead to a second measuring terminal, a generator being connectable between the supply terminals and a meter being connectable between the measuring terminals. Devices of this kind are universally used. The measuring leads are separate from the supply leads so that the resistance of the supply leads and contact resistances do not affect the measurements. The meter is matched to the quantity to be measured. The load may be an appliance which is to be powered by a prescribed voltage. In that case the meter may be a voltmeter. If the load is a measuring resistor through which a fixed current is to flow, the meter may be a millivoltmeter. If one of the four said leads is interrupted, a problem arises. This is already the case if the resistance exceeds a given limit value. The current value measured on the meter then decreases, even to zero in the case of an interruption. In the case of an interruption of a supply lead, no measuring error occurs as yet. However, an output signal of the meter is often used as a control signal for the generator. Consequently, increasing the supply voltage can be hazardous for the meter. In order to supervise the presence of the four said leads in a simple manner, the invention is characterized in that a bridge resistor is connected between the first and the second measuring terminal, the value of the said resistor being high with respect to the resistance of the load. A voltage difference signal generator is connected between each of the two measuring terminals and each of the two supply terminals.

If one of the four leads is interrupted, the said bridge resistor serves as a short-circuit. As a result, the potential at one end thereof changes. This can be detected by a voltage difference generator. The resultant signal can serve, for example, as an error signal.

The voltage difference signal generators are preferably transistors, the said signal preferably being a current variation. Transistors can be switched from the conductive to the cut-off state by small voltage differences so they are very suitable for this purpose.

The emitter-collector current path of the one transistor is preferably connected to a drive electrode of the second transistor.

Figure 2:
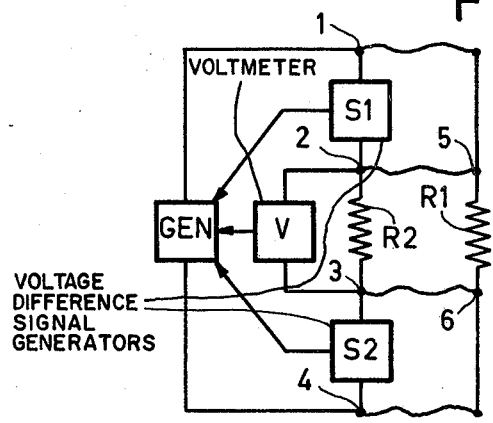
Figure 3:
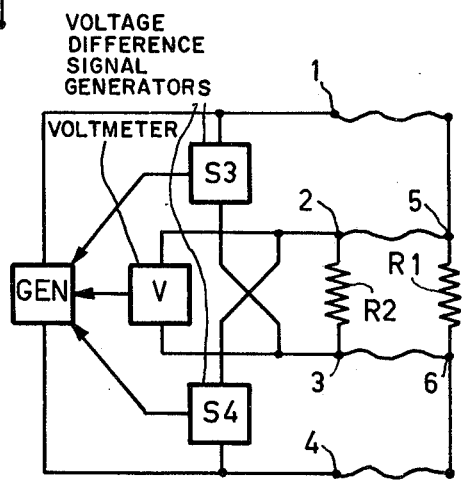
Figure 4:
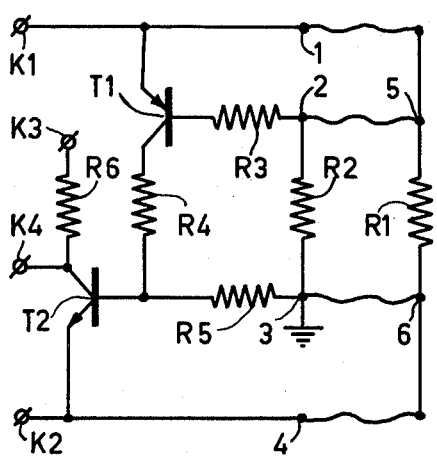
Figure 5:
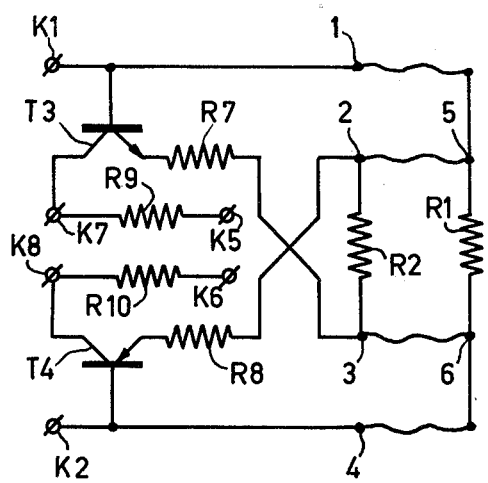

The invention will be described in detail hereinafter with reference to the accompanying drawing in which:

FIG. 1 shows a prior art device,
FIG. 2 shows a first embodiment of the invention,
FIG. 3 shows a second embodiment of the invention, and
FIGS. 4 and 5 show the circuit details of FIGS. 2 and 3, respectively.

FIG. 1 shows a device according to the present state of the art comprising a generator GEN, a voltmeter V, a load R1 comprising ends 5 and 6, two supply terminals 1 and 4, and two measuring terminals 2, 3. The supply leads and measuring leads are denoted by wavy lines. This indicates that the load may be situated at a distance from the voltmeter and the generator. A permanent checking method to determine whether or not all these leads are present in the undisturbed state is then often difficult. The voltage across the load is measured by means of the voltmeter V. An output signal thereof is applied as a control signal to the generator GEN. If one of the supply leads or measuring leads is interrupted, the measuring signal disappears. In response thereto, the control signal controls the output voltage of the generator to a higher value. This may be very undesirable, for example, in that an output capacitor of the generator GEN may be damaged by such a high voltage. In such a case readjustment is not justified either. In that case an error signal is required. This is particularly so if the current in the load R1 may deviate from a standard value only for a very short period of time. It is known to take appropriate steps in a response to an error signal. The load R1 may be of various kinds and may consist of a variety of components. The system can be operated with direct current. The system can alternatively be operated with alternating current. If desired, the load R1 can form part of a branch of a three-phase alternating current network.

FIG. 2 shows a device according to the invention. In addition to the already mentioned components, the device comprises a resistor R2 and two voltage difference signal generators S1, 2. If all four leads are present, only a small voltage difference is present between the terminal 1 and the end 5 because the normal impedance of this lead is low. The lead between terminal 2 and the end 5 carries only a small current so that thereon again only a very small voltage difference is present. The impedance of the resistor R2 exceeds that of the load R1 and is, for example, ten times higher. The voltage difference between the terminals 1 and 2 is therefore small and the voltage difference signal generator S1 does not apply a signal to the generator GEN. If the lead between terminal 1 and the end 5 is interrupted, terminal 5 receives the same potential as terminal 4. The output voltage of the generator GEN is then substantially present between the terminals 1 and 2. In that case the resistor R2 does not perform a special function. If the lead between terminal 2 and the end 5 is interrupted, the current through the resistor R2 is substantially interrupted. The resistance of the voltage difference signal generator S1 between the terminals 1 and 2 is high with respect to the resistor R2. The voltage difference between terminals 2 and 3 then substantially disappears. Consequently, terminal 2 has substantially the potential of supply terminal 4 and the output voltage of generator GEN is substantially present between the terminals 1 and 2. This is detected by S1 which applies an error signal to the generator GEN. An interruption in one of the two other leads has corresponding consequences.

FIG. 3 shows a second device according to the invention. The difference signal generators S3 and S4 are new elements. If the lead between terminal 1 and the end 5 is interrupted, terminal 2 receives substantially the same potential as terminal 4. The same applies to an interruption in the lead between terminal 2 and the end 5. The voltage difference signal generator S4 detects the disappearance of a voltage difference and applies an error signal to the generator GEN.

FIG. 4 is an elaboration of FIG. 2. In addition to the previously described components there are provided: four resistors R3 . . . 6, two transistors T1, 2, and four terminals K1 . . . 4. The positive pole of a direct current source (GEN) can be connected to terminal K1, while the negative pole thereof can be connected to terminal K2. If all terminals 1 . . . 4 are connected to the associated ends of the load, only a very small voltage difference, for example, amounting to 10 mV, exists between the terminals 1 and 2. As a result, the transistor T1 remains cut off. The measuring terminal 3 is connected to ground, the measuring ground. Terminal K3 is to be connected to a positive supply voltage. Only a small voltage difference is again present between the terminals 3 and 4, with the result that terminal K2 is substantially at ground potential and terminal K1 has a positive potential. Because of the small voltage difference between the terminals 3 and 4, the transistor T2 is also cut off. As a result, terminal K4 has a high potential.

If the connection between the supply terminal 1 and the end 5 is interrupted, no supply current flows through the load R1. Consequently, there is no voltage drop between the ends 5 and 6, with the result that terminal 2 will be at ground potential. The base electrode of the transistor T1 then has a comparatively low potential, with the result that this transistor becomes conductive.

If the connection between the measuring terminal 2 and the end 5 is interrupted, the supply current continues to flow undisturbed. The base current of the transistor T1 is small, and hence the base electrode thereof is substantially at ground potential. As already described, transistor T1 starts to conduct again. If transistor T1 is conductive, the collector thereof has a high potential and this also applies to the end of the resistor R4 which is remote from the transistor T1.

If the connection between the supply terminal 4 and the end 6 is interrupted, no supply current flows through the load R1. In that case substantially the full supply voltage is present between the terminals 3 and 4, so that the base electrode of transistor T2 is at a comparatively high potential.

If the connection between the measuring terminal 3 and the end 6 is interrupted, the supply current continues to flow undisturbed. Consequently, the transistor T1 remains cut off. The base current of transistor T2 is small and hence the base electrode thereof is substantially at ground potential, like the end 5. Consequently, the potential of the base electrode of the transistor T2 is comparatively high.

If one of the four terminals 1 . . . 4 is not connected to the associated end of the load R1, consequently, the base electrode of the transistor T2 always has a comparatively high potential. This is also applicable if the terminals 1 and 2 are not simultaneously connected. This is likewise applicable if the terminals 3 and 4 are not simultaneously connected. In that case the transistor T2 becomes conductive. As a result, the collector electrode thereof assumes a comparatively low potential, thus implying an error signal.

The resistors R3, 4, 5 are adjusting resistors. Their resistance is determined by the supply voltage between the terminals K1, 2 and the type of transistor. They may be dispensed with in given circumstances.

FIG. 5 is an elaboration of FIG. 3. In addition to the previously described components, the circuit comprises two transistors T3, 4, four resistors R7 . . . 10, and four terminals K5 . . . 8. Terminal K1 is again connected to the positive output of a generator which is not further shown. Terminal K2 is connected to the negative output of the generator. Terminal K5 is connected to the positive output of a voltage source. Terminal K6 is connected to the negative output of a voltage source. In the normal condition (all connections and the supply current present) the two transistors T3, 4 are conductive. The terminal K7 then has a low potential with respect to terminal K5, and terminal K8 has a high potential with respect to terminal K6.

If the connection between terminal 1 and the end 5 of the load R1 is interrupted, terminal 2 assumes the potential of terminal K2, with the result that transistor T4 is cut off. As a result, the voltage source no longer supplies a current so that the transistor T3 is also cut off. If the connection between terminal 2 and the end 5 is interrupted, terminal 2 assumes a low potential, so that the transistor T4 is cut off. Corresponding phenomena occur in the case of interruption of a connection to the end 6. As in the device shown in FIG. 4, an error signal is then present at the collector of T4, i.e. at terminal K7 and/or terminal K8.

What is claimed is:

1. A device for monitoring a measuring circuit connected to a load to be supplied with an electric current from a source of electric energy comprising, a first supply lead connecting a first end of said load to a first supply terminal of the energy source, a first measuring lead connecting said first end of the load to a first measuring terminal of an electric measuring device, means including a second supply lead connecting a second end of the load to a second supply terminal of the energy source and by a second measuring lead to a second measuring terminal of the measuring device, respectively, a bridge resistor connected between the first and the second measuring terminal, the resistance value of said bridge resistor being high with respect to the resistance of the load, first and second voltage difference signal generators each having three electrodes, means connecting first and second electrodes of the first signal generator between the first measuring terminal and the first supply terminal and first and second electrodes of the second signal generator between the second measuring terminal and the second supply terminal, respectively, and means including the third electrode of one of said signal generators for deriving an error signal upon interruption of any of said supply and measuring leads.

2. A monitoring device as claimed in claim 1, wherein the voltage difference signal generators comprise first and second transistors which derive a current variation signal.

3. A device as claimed in claim 2, including means connecting the emitter-collector current path of the first transistor to a control electrode of the second transistor.

4. A power supply system for energizing a load comprising, a source of electric energy having first and second current output terminals, an electric measuring device having first and second input terminals and a given first impedance value, said load having first and second current input terminals and a second value of impedance, first means connecting said load first current input terminal to the energy source first current output terminal and to the measuring device first input terminal, second means connecting said load second current input terminal to the energy source second current output terminal and to the measuring device second input terminal, a bridge impedance having a third impedance value and connected between the measuring device first and second input terminals, first and second signal generators each having three electrodes, means connecting first and second electrodes of the first signal generator between the energy source first output terminal and the measuring device first input terminal and first and second electrodes of the second signal generator between the energy source second output terminal and the measuring device second input terminal, respectively, and means including the third electrode of one of said signal generators for generating an error signal upon interruption of either of said first and second connecting means.

5. A power supply system as claimed in claim 4 wherein the third impedance value is chosen to be substantially higher than the second impedance value and substantially lower than the first impedance value.

6. A power supply system as claimed in claim 4 wherein said first and second signal generators comprise first and second transistors, respectively, including means connecting the emitter-collector current path of one of said transistors to a control electrode of the other transistor.

7. A power supply system as claimed in claim 4 wherein the first and second signal generators comprise first and second transistors, respectively, and with the base-emitter circuits thereof respectively connected between the energy source output terminals and the measuring device input terminals, and the emitter-collector circuit of one transistor being connected to a control electrode of the other transistor.

8. A power supply system as claimed in claim 4 wherein said first and second signal generators comprise first and second transistors, respectively, and including means exclusive of said energy source first and second output terminals for connecting the emitter-collector paths of said transistors and the bridge impedance in series circuit across a source of voltage.

9. A power supply system as claimed in claim 4 wherein said first connecting means comprises first and second electric conductors connected between the load first current input terminal and the energy source first output terminal and the measuring device first input terminal, respectively, and the second connecting means comprises third and fourth electric conductors connected between the load second current input terminal and the energy source second output terminal and the measuring device second input terminal, respectively.

10. A power supply system as claimed in claim 4 wherein the energy source comprises a current generator and further comprising means for coupling said error signal back to the current generator to control the operation thereof.

* * * * *

UNITED STATES PATENT AND TRADEMARK OFFICE
CERTIFICATE OF CORRECTION

PATENT NO. : 3,970,930
DATED : July 20, 1976
INVENTOR(S) : JOHANNES VOLKERT VERMOLEN It is certified that error appears in the above–identified patent and that said Letters Patent are hereby corrected as shown below:

Claim 2, line 4, before "signal" insert -- error --;

Signed and Sealed this

Fourteenth Day of September 1976

[SEAL]

Attest:

RUTH C. MASON
Attesting Officer

C. MARSHALL DANN
Commissioner of Patents and Trademarks